United States Patent [19]

Kardontchik et al.

[11] Patent Number: 5,399,995
[45] Date of Patent: Mar. 21, 1995

[54] CMOS CIRCUIT PROVIDING 90 DEGREE PHASE DELAY

[75] Inventors: Jaime E. Kardontchik, Sunnyvale; Sam H. Moy, San Bruno, both of Calif.

[73] Assignee: Raytheon Company, Lexington, Mass.

[21] Appl. No.: 225,126

[22] Filed: Apr. 8, 1994

[51] Int. Cl.[6] .............................................. H03L 7/00
[52] U.S. Cl. ...................................... 331/17; 331/1 A; 331/18; 331/25; 331/57; 341/68; 360/41; 360/51; 375/120
[58] Field of Search ...................... 331/1 A, 17, 18, 25, 331/57; 341/68-74; 375/120; 360/51, 40-44

[56] References Cited

U.S. PATENT DOCUMENTS

| | | | |
|---|---|---|---|
| 4,868,522 | 9/1989 | Popat et al. | 331/2 |
| 5,043,677 | 8/1991 | Tomassetti et al. | 331/17 X |
| 5,163,067 | 11/1992 | Wight et al. | 341/70 X |
| 5,164,966 | 11/1992 | Hershberger | 375/120 X |
| 5,172,397 | 12/1992 | Llewellyn | 307/269 X |
| 5,180,994 | 1/1993 | Martin et al. | 331/38 |
| 5,191,301 | 3/1993 | Mullgrav, Jr. | 331/57 |
| 5,239,274 | 8/1993 | Chi | 331/57 |
| 5,250,913 | 10/1993 | Gleichert et al. | 375/120 X |
| 5,258,877 | 11/1993 | Leake et al. | 375/120 X |
| 5,260,841 | 11/1993 | Suzuki et al. | 360/51 |
| 5,307,028 | 4/1994 | Chen | 360/51 X |
| 5,343,167 | 8/1994 | Masumoto et al. | 331/2 |

OTHER PUBLICATIONS

"A 30-MHz Hybrid Analog/Digital Clock Recovery Circuit in 2-$\mu$m CMOS," B. Kim, D. N. Helman, P. R. Gray, *IEEE Journal of Solid State Circuits*, vol. 25, No. 6 pp. 1385-1394, Dec. 1990.

*Primary Examiner*—David Mis
*Attorney, Agent, or Firm*—William R. Clark

[57] ABSTRACT

A high speed clock recovery system that provides a precise 90° phase shift at the incoming NRZ data rate by using a series of differential inverters and controlling their delays in accordance with the corresponding delays of differential inverters of a ring oscillator that is part of a phase-locked loop. More particularly, the incoming NRZ data and the phase shifted data are fed to an exclusive OR that provides an output signal including a frequency component of the originating clock of the NRZ data. The phase-locked loop further includes a phase detector which is responsive to the output of the exclusive OR and the ring oscillator. Thus, once the loop locks, the ring oscillator is synchronized to the frequency of the originating clock for the NRZ data. By slaving the differential inverters of the phase shifter and the ring oscillator to the same delays, the phase shifter provides a dynamically adjusted delay of precisely 90° at the originating clock frequency of the incoming NRZ data.

23 Claims, 5 Drawing Sheets

CMOS CIRCUIT PROVIDING 90 DEGREE PHASE DELAY

BACKGROUND OF THE INVENTION

The field of the invention generally relates to high speed clock recovery systems, and more particularly relates to an integrated CMOS circuit that provides a precise 90° phase delay or shift at a desired frequency.

As is well known, high speed data is usually transmitted and received in a non-return-to-zero (NRZ) format to minimize distortion by reducing the high frequency content of the signals. For example, consider a string of incoming data 10010 in a NRZ format at a 200 Mbit/sec rate where each bit uses a full period of 5 nanoseconds. The receiver has to generate a clock, usually referred to as the "recovered clock", at exactly 200 MHz, and align the clock with respect to the incoming data. For example, it is desirable that the positive transitions of the recovered clock occur at the exact middles of the data bits where one would expect the maximum voltage if the received bit is a logical "1", or the minimum voltage if the received bit is a logical "0". Once the clock is recovered, the NRZ signals and the recovered clock are respectively fed to the "data" and "clock" inputs of a flip-flop which functions as a decision device. That is, the flip-flop will be clocked by the recovered clock, and the output will be the recovered data in a clean "1" or "0" state.

Since the desired clock frequency does not appear in the frequency spectrum of the NRZ data, a non-linear operation is normally applied to the incoming data to generate a frequency component containing the clock frequency. In a typical prior art approach, the incoming NRZ data is delayed by 90° in a phase shifter, and the original and delayed NRZ data are fed to an exclusive OR (XOR) gate. As is well known, the output of the XOR will have a frequency component corresponding to the originating or desired clock. The output of the XOR is then fed to a phase comparator or detector along with the output of a voltage controlled oscillator (VCO) or current controlled oscillator (CCO). The phase comparator and the VCO or CCO are part of a phase-locked loop. That is, the output of the phase comparator is used to generate a control voltage or current to the VCO or CCO such that the VCO or CCO is finally brought to oscillate at the same frequency as the originating clock of the incoming NRZ data. However, the VCO or CCO output can not be used to clock the decision device or flip-flop because it is not aligned at the optimum decision point at the middle of the bit period. Thus, it is necessary to provide a clock that is 90° out-of-phase or is in quadrature with the VCO or CCO output. This quadrature clock is then used to clock the decision device, and it catches the NRZ data at the optimum decision points at the exact middles of data bits. Typically, the quadrature clock is generated by running the VCO or CCO at twice the needed frequency and using divide-by-2 circuits. One drawback of running the VCO or CCO at twice the needed frequency is that more advanced and expensive technologies are generally required.

Referring back to the incoming NRZ data before the exclusive OR, a precise 90° phase shift is required. Otherwise, the recovered clock will not be aligned with the positive clock transitions occurring exactly at the middle of the data bits, and errors in recovered data may occur. One possible prior art approach is described in H. Ransijn and P. O'Connor, "A PPL-based 2.5 Gb/s GaAs Clock and Data Generator IC", IEEE Journal of Solid-State Circuits, Vol 26, October 1991, pp 1345-1353. An input is fed to a branch wherein one leg has a series resistor followed by a capacitor to ground, and the other leg has a series capacitor followed by a resistor to ground. With such arrangement, two outputs are produced, and one always lags the other by 90°. Thus, a 90° phase shift can be provided for the incoming NRZ data. One problem with this arrangement is that the amplitudes of the two outputs are different. Thus, additional phase delays will be introduced into following circuits except at one frequency $w_o$ where $$w_o = 1/[RC]$$

In an integrated circuit, it is difficult to control the absolute values of resistors R and capacitors C. Typically, the resistance of integrated resistors may vary by plus or minus 30% for wafers processed in different lots, and the capacitance C may typically vary by plus or minus 15%. Therefore, it is very difficult to provide equal amplitudes unless costly trimming is added.

SUMMARY OF THE INVENTION

In accordance with the invention, the 90° phase shift of the incoming NRZ input data signal is provided by operating the phase shifter in response to the phase-locked loop. More particularly, a phase-locked loop including a phase detector and a voltage or current controlled oscillator is required downstream anyway as part of the clock recovery system. Here, a current controlled oscillator includes a plurality of differential inverters connected in a ring to form a ring oscillator. In response to the total control current $i_o$ in the phase-locked loop, a current mirror arrangement is used to draw this same current $i_o$ from each differential inverter, and thus to control the delay of each differential inverter. As a result, the oscillator output frequency is synchronized to the frequency component of the originating clock in the XOR output. The initial phase shifter also includes differential inverters that are connected in a series rather than a ring. The same current mirror arrangement is used to draw the same current $i_o$ from these differential inverters. In particular, the differential inverters of the phase shifter are replicas of the differential inverters of the ring oscillator, and all are operated under the same operating conditions and voltage biases to provide the same dynamic operating delay. The number of differential inverters in the phase shifter is selected to provide a precise delay or shift of 90° at the output frequency of the ring oscillator. Therefore, once the phase-locked loop locks and the ring oscillator output is synchronized to the frequency component of the originating clock, the phase shifter provides a precise delay of 90° for the incoming NRZ input data.

With such arrangement, all of the differential inverters are part of an integrated circuit, and therefore are made with the same process parameters and materials, and operate at the same chip temperature. Thus, the precise 90° delay or shift is dynamically provided without any need for trimming or any other labor or time consuming process.

BRIEF DESCRIPTION OF THE DRAWINGS

The foregoing objects and advantages will be more fully understood by reading the following Description of the Preferred Embodiment with reference to the drawings wherein.

DESCRIPTION OF THE PREFERRED EMBODIMENT

Figure 1:
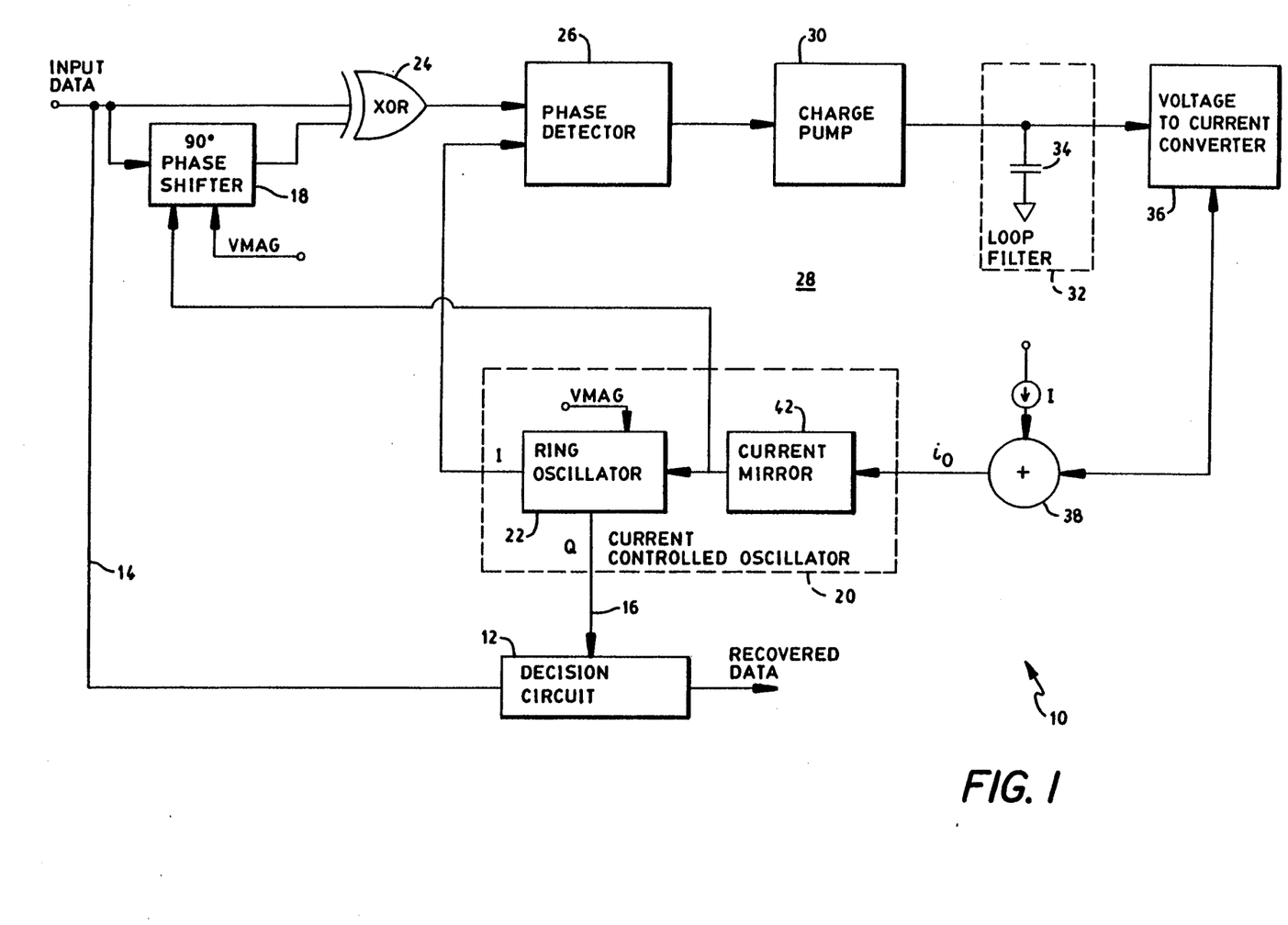
FIG. 1 is a block diagram of a clock recovery system for high speed communications.
Figure 2A:
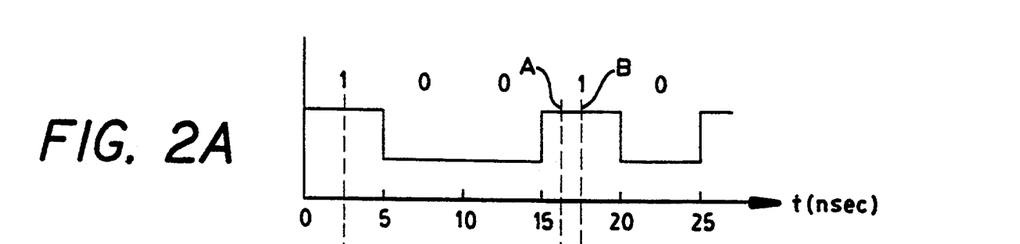
FIGS. 2A–2E show waveforms at various stages of the clock recovery system.

Referring to FIG. 1, a clock recovery system 10 receives an input data signal in non-return-to-zero (NRZ) format, and generates a recovered clock that is fed to decision circuit 12 to provide clean recovered data. FIG. 2A shows an example of a string of 10010 . . . data in a NRZ format at 200 Mbit/sec rate. For this example, each bit uses a full period of 5 nanoseconds. For simplicity, an ideal waveform has been drawn, but those of skill in the art will understand that the received data signal will typically be distorted and have noise and jitter that normally accompanies data after being transmitted through a channel. That is, the incoming signal would typically have rounded corners since the channel attenuates high frequency components, and there will be erratic variations of the voltage due to erratic amplitude variations and timing variations at the beginning and ending of each bit. An originating clock used to time the generation of the NRZ data at a remote transmitter site is not transmitted with the NRZ data. Thus, the purpose of the clock recovery system 10 is to take the incoming NRZ data and generate a recovered clock that is at the exact frequency as the originating clock used to time the NRZ data at a remote transmitter site, and aligned so that the positive transitions occur at exactly the middle of the data bits where the maximum level for a "1" and the minimum level for a "0" would be expected to occur. The recovered clock and the NRZ data signal are fed to the decision circuit 12 which is typically a flip-flop (not shown). More specifically, the NRZ data signal is fed on line 14 to the data input and the recovered clock is fed on line 16 to the clock input, and the output of the decision circuit 12 is the recovered data is clean l's and 0's.

As is well known, the desired or originating clock frequency does not appear in the frequency spectrum of the incoming NRZ data signal. Therefore, a non-linear operation is typically applied to the NRZ data signal to generate a signal containing a frequency component of the originating clock. Here, the incoming NRZ data is fed to 90° phase shifter 18 to provide a signal that is delayed by 90° from the incoming NRZ data. As will be described in detail later herein, 90° phase shifter 18 is slaved to the current controlled oscillator 20 to provide a delay or shift of the incoming NRZ data signal that is exactly 90° at the frequency of the output signal of ring oscillator 22. As will be described, the ring oscillator 22 eventually locks to the NRZ clock frequency imbedded in the output from exclusive OR (XOR) 24. Thus, as shown in FIG. 2B, 90° phase shifter 18 provides an output that is the NRZ data signal delayed by exactly 90°.

Figure 2B:
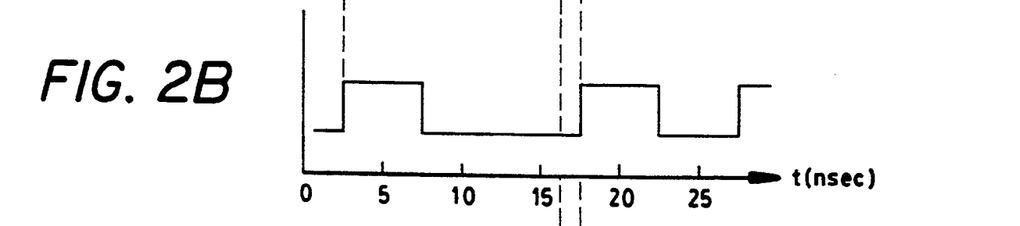
Figure 2C:
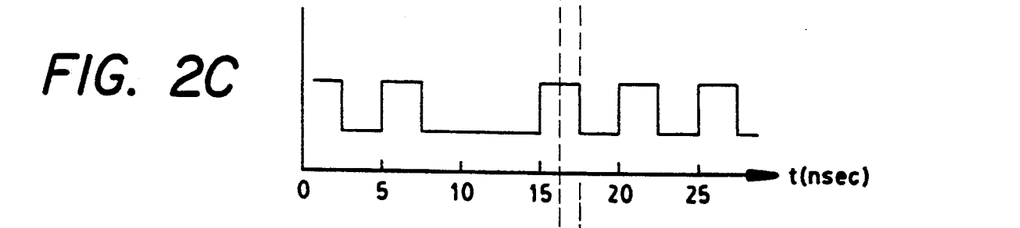

The incoming NRZ data signal as shown in FIG. 2A and the 90° delayed output signal from 90° phase shifter 18 as shown in FIG. 2B are fed to conventional XOR 24. As is well known, XOR 24 provides a high signal only when one of its inputs is low and the other input is high. Thus, for the example input as shown in FIGS. 2A and 2B, XOR 24 provides the waveform shown in FIG. 2C. As is well known to those skilled in the art, this waveform includes a frequency component of the originating clock for incoming NRZ data.

The output of XOR 24 is coupled to phase detector 26 or comparator that is part of a phase-locked-loop (PLL) 28. In particular, the phase-locked-loop 28 further includes charge pump 30, loop filter 32 including capacitor 34, voltage to current converter 36, current adder 38, and current controlled oscillator 20 which includes a current mirror 42 and ring oscillator 22. The output of phase detector 26, and thus charge pump 30, is dependent on the phase relationship between the output of XOR 24 and the output of ring oscillator 22. More specifically, according to well known phase-locked loop principles, the output current of charge pump 30 is zero when the output of ring oscillator 22 is synchronized in frequency and phase to the embedded NRZ data frequency component in the output of XOR 24. In contrast, when there is a phase difference between the two, charge pump 30 charges or discharges capacitor 34 to provide a current from voltage to current converter 36 that functions to adjust current controlled oscillator 20 into synchronism with the frequency component of the originating clock for the incoming NRZ data. The current from voltage to current converter 36 is added with constant current I in current adder 38 to provide a total feedback current $i_o$ that is fed to current controlled oscillator 20.

Figure 3:
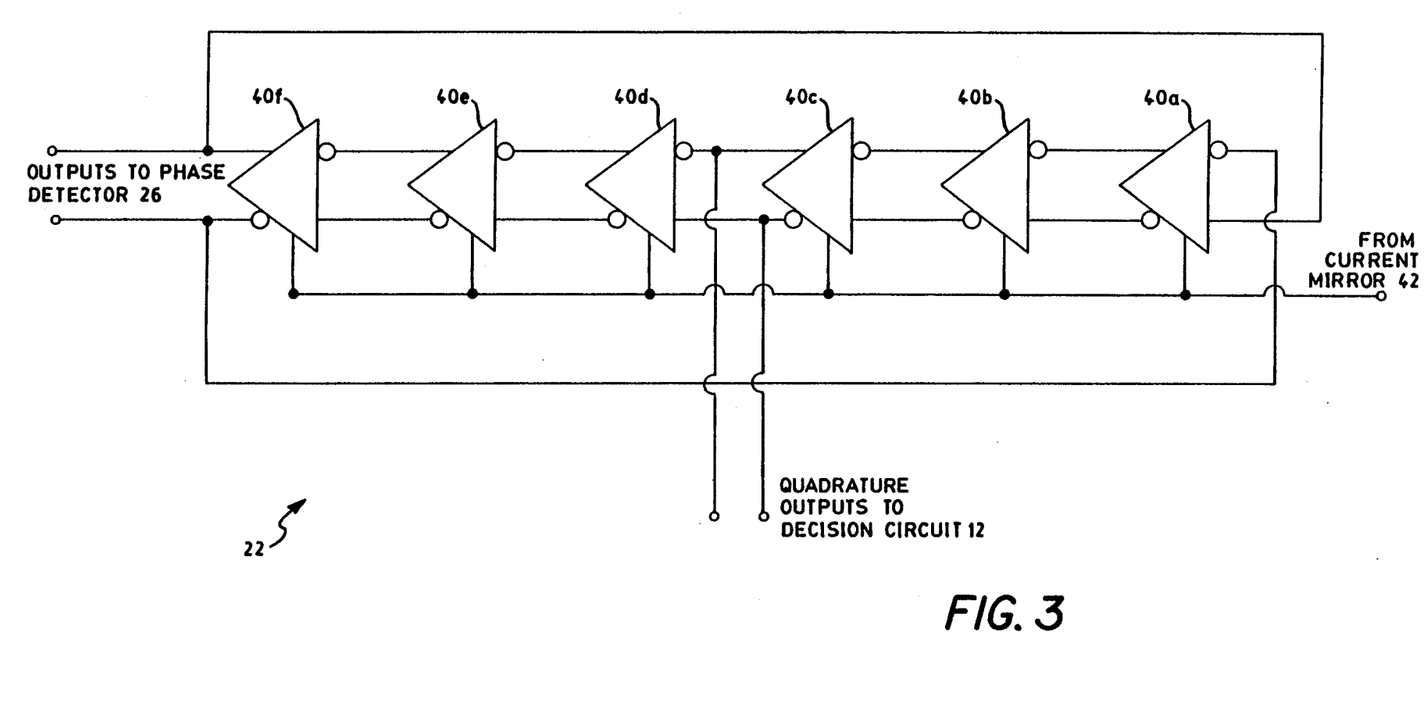
FIG. 3 shows a block diagram of the ring oscillator of FIG. 1.

Referring to FIG. 3, ring oscillator 22 includes a plurality of fully differential inverters 40a–f each of which has a pair of inputs and a pair of outputs. As shown, the outputs of inverters 40a–e are connected to corresponding inputs of inverters 40b–f to form a series of cascaded inverters 40a–f, and the outputs of inverter 40f are reversed or inverted and fed to the inputs of inverter 40a to form a ring. Normally, an odd number of inverters are required to enable a ring oscillator to oscillate. Here, however, oscillation is enabled with an even number of inverters because the differential outputs from one inverter 40f are reversed with respect to the differential inputs of another inverter 40a. In particular, inverters 40a–f function as delay circuits with a delay here defined as Td. If the inverting input, here defined as the upper input with the inverting symbol, of inverter 40a goes low at time t=0, then its corresponding noninverting output, here defined as the upper output without the inverting symbol, will go high at time Td. As this signal propagates through the ring of inverters 40a–f, it will appear as low at the noninverting output of inverter 40b at time 2Td, high at the noninverting output of inverter 40c at time 3Td, low at the noninverting output of inverter 40d at time 4Td, high at the noninverting output of inverter 40e at time 5Td, and low at the noninverting output of inverter 40f at time 6Td. Since the connection between differential outputs of inverter 40f and the differential inputs of inverter 40a are reversed (i.e. noninverting output to noninverting input and inverting output to inverting input), a low at the noninverting output of inverter 40f is equivalent to a high for inverting input of inverter 40a. Therefore, at time 6Td, the inverting output of inverter 40a will go high, and stay high, until the change propagates through all six inverters. In summary, the inverting input of inverter 40a which here is assumed to start low, goes high at 6Td, and then goes low again at 12Td. In this way, ring oscillator 22 oscillates with an even number of fully differential inverters 40a-f, and an oscillation period for the six inverter ring shown in FIG. 3 is 12Td. In general, for an n-stage differential ring oscillator with n being even, the oscillation period is 2nTd.

Figure 2D:
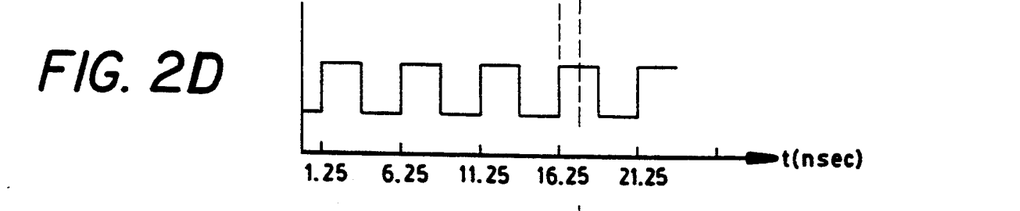
Figure 2E:
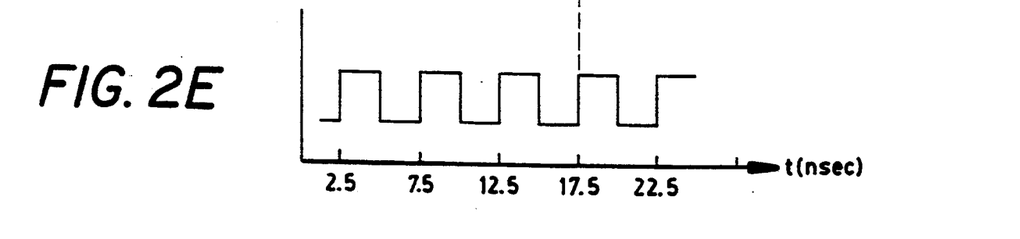

As will be described in detail with reference to FIG. 5, inverters 40a-f are matched to have equal delays, and the delays are determined by the total feedback current $i_o$ provided to current mirror 42. In general, the current from phase detector 26 increases or decreases to increase or decrease the delays of inverters 40a-f to drive the differential output of ring oscillator 22 in frequency and phase synchronism with the output of XOR 24. For example, if the originating clock of the incoming NRZ data is at a 200 MHz rate, the phase-locked-loop 28 will lock when the output of ring oscillator 22 from inverter 40f is at a 200 MHz rate, and the transitions are aligned as shown in FIG. 2D. However, as can be seen by comparing FIG. 2D with the incoming NRZ data in FIG. 2A, the differential outputs from inverter 40f that are used in the phase-locked-loop 28 to feed phase detector 26 are not properly aligned to function as the clock for decision circuit 12. More specifically, the positive transitions of the clock from inverter 40f are aligned to catch the NRZ data at point A as shown in FIG. 2A rather than at the optimum position B in the middle of the bit period. Thus, it is desirable to provide a clock that is in quadrature, or has a shift in phase of 90° from the differential outputs of inverter 40f that are fed to phase detector 26. As described heretofore, an oscillation period is equal to the delay through 12 inverters or 12Td. Thus, differential outputs from inverter 40c which are delayed by 3 inverters or 3Td from the outputs of inverter 40f are exactly in quadrature from the outputs of inverter 40f that are fed back to phase detector 26. That is, as shown in FIG. 2E, the quadrature outputs from inverter 40c of ring oscillator 22 are shifted in phase by 90° from the outputs of inverter 40f, and therefore serve as a clock for decision circuit 12 with the positive transitions catching the NRZ data at the point B in the middle of the bit periods.

Figure 4:
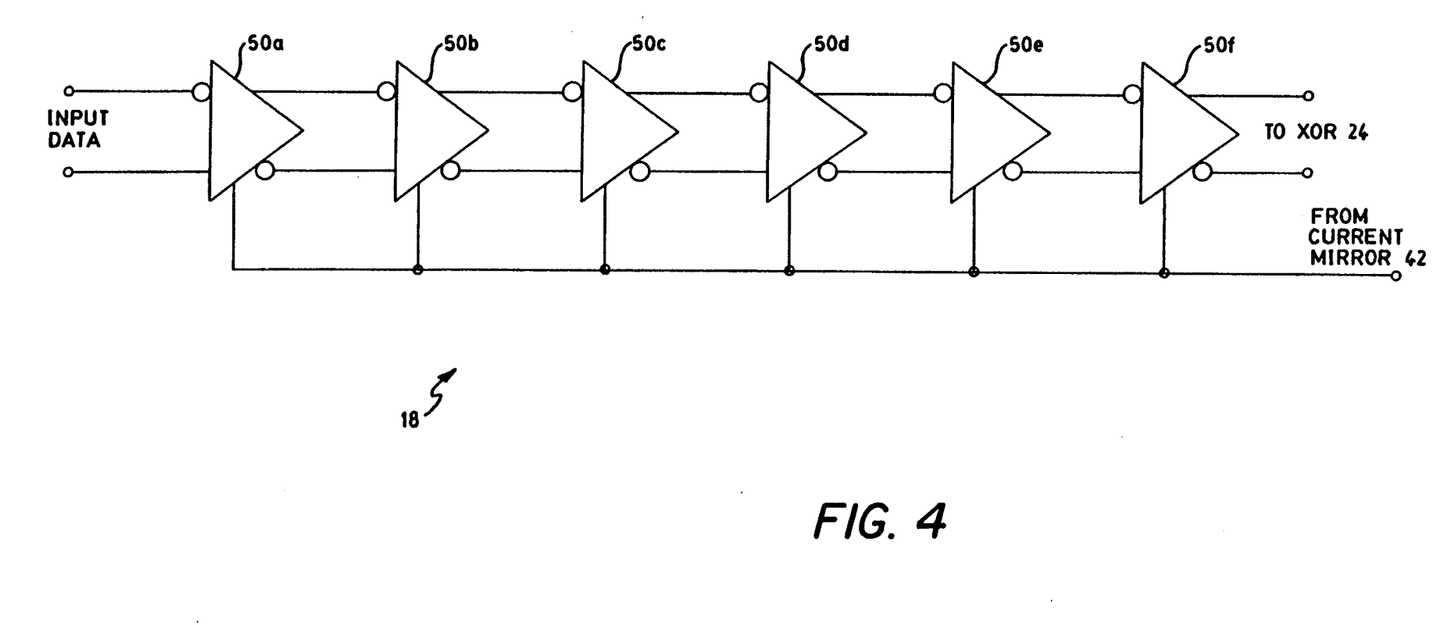
FIG. 4 shows a block diagram of the 90° phase shifter of FIG. 1.

Referring to FIG. 4, 90° phase shifter 18 also includes a plurality of fully differential inverters 50a-f that are matched to inverters 40a-f. Each inverter 50a-f has a pair of differential inputs and a pair of differential outputs. As shown in FIG. 4, outputs of inverters 50a-e are connected to corresponding inputs of inverters 50b-f. However, unlike ring oscillator 22, inverters 50a-f are not connected in a ring, but rather form a cascaded series with inverter 50a receiving the NRZ input data to 90° phase shifter 18, and with inverter 50f providing the output to XOR 24. Further, each of inverters 50a-f receives an input from current mirror 42 and therefore operates under the same operating conditions as inverters 40a-f to produce the same delays as respective inverters 40a-f. Stated differently, inverters 50a-f are copies or slaves of inverters 40a-f but without the feedback loop that forms the ring and causes oscillation in the manner described heretofore. Ring oscillator 22 was described with reference to an example where the originating clock of the incoming NRZ data was at a 200 MHz rate thus causing PLL 28 to lock when the output of ring oscillator was 200 MHz. Continuing with this example, each inverter 40a-f and 50a-f operates to provide a delay of 5 nanoseconds divided by 12 because ring oscillator 22 uses six inverters 40a-f, and two cycles are required to return to the same logic state. Therefore, because 90° phase shifter 18 has the same number of inverters, here six, and they are matched and slaved to have the same delays as inverters 40a-f, the six inverters 50a-f in 90° phase shifter 22 provide a delay of 2.5 nanoseconds for this example. Referring to FIG. 2A and 2B, this is the exact amount of delay needed for the NRZ incoming data. Therefore, 90° phase shifter 18 is slaved to provide a delay in accordance with the output of ring oscillator 22, and this delay represents precisely 90° of phase shift for the incoming NRZ data. Those of skill in the art will recognize that when PLL 28 has not yet locked to the incoming data, ring oscillator 22 will not be running at the originating clock rate of the NRZ data here assumed to be 200 MHz as an example. Therefore, under this condition, the delay produced by inverter 50a-f will not provide a 90° phase shift for the incoming NRZ data. However, any reasonable initial phase delay of the nominally 90° phase shifter 18 will be sufficient to recreate the frequency of the originating clock after XORing. Once the phase-locked loop 28 locks into the originating frequency embedded in the XORed data, the delay of the 90° phase shifter 18 will become precisely 90°, as defined in FIG. 2B. Such operation is acceptable because the system 10 will not try to recover data until PLL 28 is locked, and by that time the phase shifter 18 provides a precise 90° delay for the incoming NRZ data.

Figure 5:
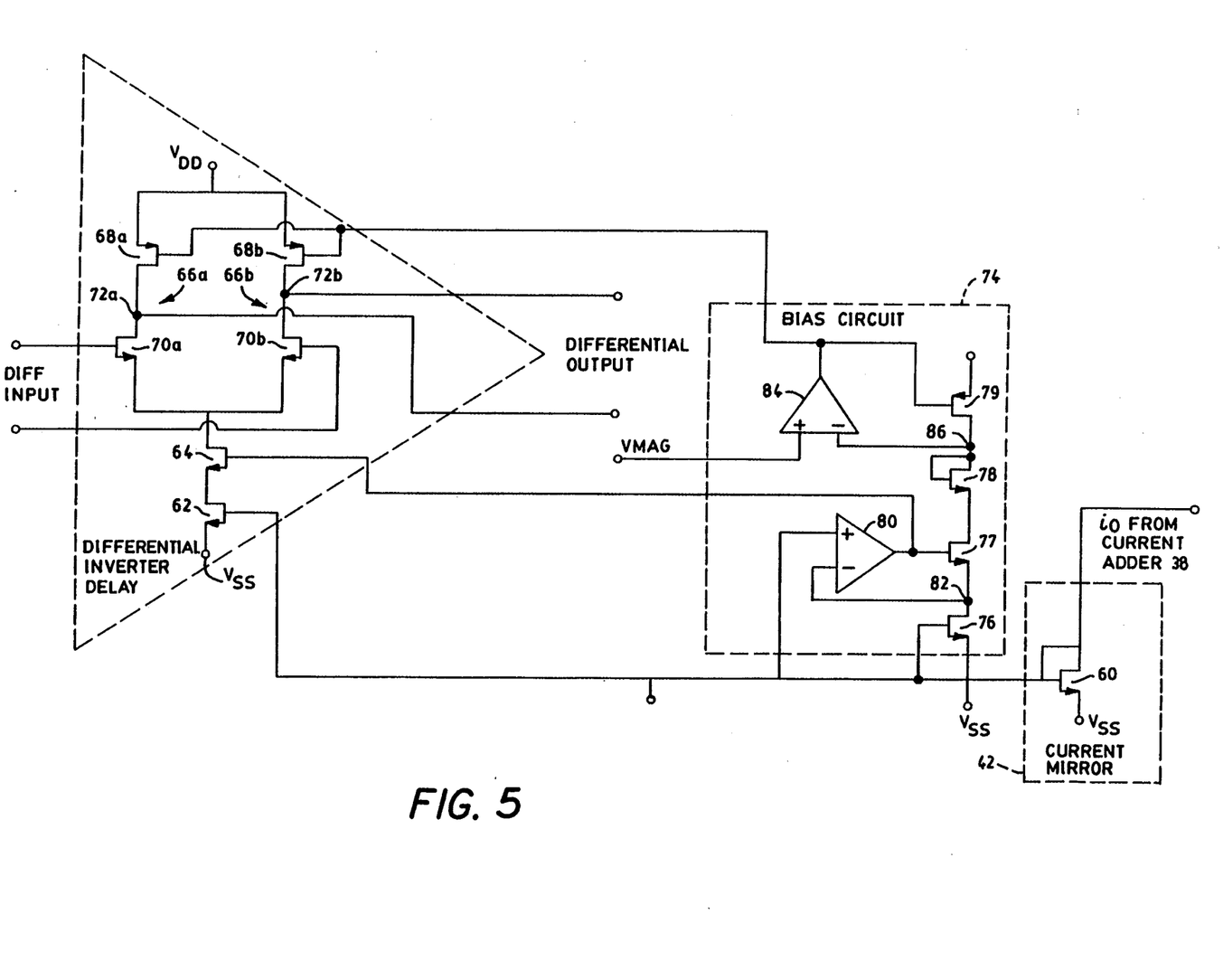
FIG. 5 shows a simplified circuit implementation of one of the identical differential inverters of the 90° phase shifter or the ring oscillator, and also includes a bias circuit and current mirror.

Referring to FIG. 5, a simplified schematic of one of inverters 40a-f or 50a-f as implemented in CMOS technology is shown. Inverters 40a-f and 50a-f are all the same or matched. That is, inverters 40a-f and 50a-f are copies formed using the same processes and materials on the same integrated circuit, and function under the same operating conditions such as bias and temperature. Thus, inverters 40a-f and 50a-f are slaved together, and all exhibit the same dynamic or instantaneous delay in response to the total PLL feedback current $i_o$. Therefore, only one inverter will be described with reference to FIG. 5, but it is understood that the description is applicable to all inverters 40a-f and 50a-f.

Still referring to FIG. 5, the total PLL feedback current $i_o$ flows through MOS transistor 60 which is here shown as a diode connected n-type. The gate of transistor 60 is connected in common to the gate of MOS transistor 62 here shown as an n-type, and transistor 62 mirrors the current of transistor 60. Thus, transistor 62 of each inverter 40a-f and 50a-f operates as a current source, and the total PLL feedback current $i_o$ flows through each transistor 62. MOS transistor 64, here shown as an n-type, is connected in series with transistor 62 and serves to enhance the accuracy of the current mirror function of transistor 62.

The $i_o$ current that flows through transistor 62 is drawn from either leg 66a or 66b. Leg 66a includes transistor 68a here shown as a p-type, and MOS transistor 70a here shown as an n-type. Leg 66b includes MOS transistor 68b here shown as a p-type and MOS transistor 70b here shown as an n-type. MOSFET transistors 68a and b are operated below their saturation voltage (i.e. in their linear or triode region), and thus function as resistors that vary in resistance here in response to their gate voltage. Transistors 70a and b function as switches that are turned on and off in differential or complementary manner by the respective outputs of previous inverters 40a-f and 50b-f or, in the case of inverter 50a, by the differential inputs to 90° phase shifter 18. That is, the differential inputs of inverters 40a-f and 50a-f are connected to the respective gates of transistors 70a and b to turn one on at a time. Thus, in response to the differential inputs (one being high and the other being low) transistors 70a and b are turned on and off to steer the $i_o$ current from one transistor 68a to the other transistor 68b, and visa versa. As is well understood in the art, the leg 66a or b through which the current flows has a voltage drop across the respective transistor 68a or b, while there is no voltage drop across the opposite transistor 68a or b. Thus, corresponding differential outputs are connected to respective nodes 72a and b.

The differential output voltage at nodes 72a and b oscillates between a maximum voltage $V_{DD}$ when no current is flowing through the associated transistor 68a or b and a minimum voltage $V_{DD-Rio}$ when the entire current $i_o$ flows through the associated transistor 68a or b. R is the resistance value of the associated transistor 68a or b which, as described above functions as a variable resistor. Hence, the oscillation amplitude A is given by the equation:

$$A = R \times i_o \qquad (1)$$

The oscillation frequency depends on how fast an inverter 40a-f and 50a-f drives the differential inputs of the next inverter to cause the transistors 70a and b to switch their respective conduction states. In essence, the next inverter can be considered to be a capacitive load, and therefore the speed or delay of an inverter depends on how fast the current $i_o$ discharges the capacitor to the minimum voltage $V_{DD}-Ri_o$ and how fast the current through transistor 68a or b charges the capacitor to the maximum voltage $V_{DD}$.

In a circuit described by B. Kim, N. Helman and P. R. Gray entitled "A 30-MHz Hybrid Analog/Digital Clock Recovery Circuit in 2-um CMOS", IEEE Journal of Solid-State Circuits, vol 25, pp. 1385–1394, December 1990, the oscillation frequency was increased by decreasing the value of the resistance R to decrease the oscillation amplitude A while leaving the current $i_o$ constant. Here, however, the oscillation frequency is increased by the PLL 28 increasing the value of $i_o$ flowing through transistor 60, and thus transistor 62 of each inverter 40a-f and 50a-f that mirrors the current of transistor 60. However, in order to keep the oscillation amplitude A constant while realizing the frequency change effect of changing the current $i_o$, the resistances of transistors 68a and b are varied inversely to the current. This function is performed by transistor bias circuit 74.

Still referring to FIG. 5, MOS transistor 76–78, here shown as n-types, are connected in series with MOS transistor 79 here shown as p-type. The gate of transistor 76 is connected in common with the gate of transistor 60 to cause transistor 76 to mirror the current $i_o$ flowing through transistor 60. The gate of transistor 60 is also connected to the positive input terminal of operational amplifier 80 while the negative input terminal is connected to node 82 between transistors 76 and 77. The output of operational amplifier 80 is connected to the gates of transistors 64 and 77, and functions in conventional manner to enhance the accuracy of the $i_o$ mirroring function of both transistors 62 and 76. Transistor 78 is diode connected to further provide a better mirror function of current $i_o$.

Still referring to FIG. 5, operational amplifier 84 has a positive input terminal connected to $V_{mag}$, a negative terminal connected to node 86, and an output connected to the gates of transistors 79 and 68a and b. $V_{mag}$ is an internally generated dc voltage which determines the oscillation amplitude A and, which for reasons will become apparent is set as follows:

$$V_{mag} = V_{DD} - A/2 \text{ or} \qquad (2)$$

$$V_{DD} - V_{mag} = A/2 \qquad (3)$$

For example, if an oscillation amplitude of 1 volt is desired and $V_{DD}$ is 5 volts, $V_{mag}$ would be set to 4.5 volts. The feedback loop of operational amplifier 84 forces the negative input voltage $V_{n86}$ from node 86 to be equal to the positive input voltage, here $V_{mag}$. That is, $$V_{n86} = V_{mag} \qquad (4)$$

Further, the current through transistor 79 is $i_o$ as determined by transistor 76 mirroring the current through transistor 60. Current $i_o$ is large enough and the drain to source voltage, here $V_{DD}-V_{n86}$, is small enough so that transistor 79 is held in its linear or triode region. Therefore, the resistance $R_{79}$ of transistor 79 is given by $$R_{79} = [V_{DD} - V_{n86}]/i_o \qquad (5)$$

Substituting equations (3) and (4) into equation (5) results in $$R_{79} = [A/2]/i_o \qquad (6)$$

Transistor 79 is made twice as large as transistors 68a and b. Thus, the resistance of transistors 68a and b, here defined as $R_{68a}$ and $R_{68b}$ operating in their linear regions is given by:

$$R_{68a} = R_{68b} = A/i_o \qquad (7)$$

The delay of inverters 40a-f and 50a-f, and thus the oscillation frequency of ring oscillator 22, is controlled by the total current $i_o$ in the PLL 28. However, as can be seen from equation (7), transistor bias circuit 74 operates in such a manner that the resistances of transistors 68a and b vary inversely with $i_o$. Simply differently, as $i_o$ is increased, $R_{68a}$ and $R_{68b}$ are decreased to keep the product of $R_{68a\ or\ b}$ and $i_o$ constant, thus maintaining a constant amplitude A. Thus, even though $i_o$ is used to vary the frequency of current controlled oscillator 20 and the delay of 90° phase shifter 18, the amplitude A is constant. Equation (7) is dynamically adjusted which means that any time the current $i_o$ changes, or the temperature changes, or even the power supply changes, the transistor bias circuit 74 operates in a manner that holds oscillation amplitude A constant.

In summary, a phase-locked loop 28 is used as part of the clock recovery system 10, and, among other components, loop 28 includes phase detector 26 and current controlled oscillator 20. More specifically, ring oscillator 22 is made up of an even plurality of inverters 40a-f, each of which has the same delay as controlled by total feedback current $i_o$. That is, using current mirror 42, $i_o$ is caused to flow through each of inverter 40a-f thereby controlling the inverter delay, and thus the output frequency of ring oscillator 22. In accordance with the invention, 90° phase shifter 18 includes a series of inverters 50a-f that are replicas of inverters 40a-f. Further, the current mirror 42 is also used to control the current $i_o$ flowing through inverters 50a-f. Simply stated, inverters 50a-f dynamically have the same delays as inverters 40a-f, so, by using the same number of inverters 50a-f connected in a series, phase shifter 18 provides a precise 90° phase shift or delay at the output frequency of the ring oscillator 22. Thus, because the output frequency of the ring oscillator 22 is the same as the originating clock of the NRZ data once the phase-locked loop 28 locks, the incoming NRZ data is thereafter shifted by precisely 90° as defined in FIG. 2B.

This concludes the Description of the Preferred Embodiment. However, a reading of it by one of skill in the art will bring to mind many alterations and modifications that do not depart from the spirit and scope of the invention. Therefore, it is intended that the invention be limited only by the appended claims.

What is claimed is:

1. In combination:
   phase shifter means responsive to a non-return-to-zero input data signal for providing a signal shifted in phase from said input data signal;
   means responsive to said input data signal and said phase shifted signal for generating a signal which includes a frequency component of an originating clock of said input data signal; a phase-locked loop responsive to said signal from said generating means, said loop comprising an oscillator providing an output synchronized to said frequency component of the originating clock; and
   said phase shifter means providing a delay in response to said phase-locked loop to provide a phase shift of 90° at the output frequency of said oscillator.

2. The combination recited in claim 1 wherein said generating means comprises an exclusive OR.

3. The combination recited in claim 2 wherein said phase-locked loop further comprises a phase detector responsive to said exclusive OR and the output of said oscillator, said oscillator being responsive to said phase detector.

4. The combination recited in claim 1 wherein said phase shifter means comprises a plurality of inverter delay circuits connected in a series.

5. The combination recited in claim 4 wherein the delay of each of said inverter delay circuits of said phase shifter means is responsive to a current in said phase-locked loop.

6. The combination recited in claim 5 wherein said oscillator comprises a ring oscillator comprising at plurality of inverter delay circuits connected in a ring.

7. The combination recited in claim 6 further comprising means for providing each of said inverter delay circuits of said phase shifter means with the same delay as each of said inverter delay circuits of said oscillator.

8. In combination:
   means responsive to an input data signal for providing an output signal shifted in phase from the input data signal;
   means for providing an exclusive OR signal in response to the input data signal and the phase shift signal;
   phase-locked loop means comprising an oscillator having an output synchronized to said exclusive OR signal; and
   means for slaving said phase shift means to said phase-locked loop means to provide a phase shift of 90° at the frequency of said oscillator output.

9. The combination recited in claim 8 wherein said phase shift means comprises a plurality of inverter delay circuits connected in a series.

10. The combination recited in claim 9 wherein said oscillator comprises a ring oscillator comprising a plurality of inverter delay circuits connected in a ring.

11. The combination recited in claim 10 wherein said slave means comprises means for controlling the delay of each of said inverter delay circuits of said phase shift means in accordance with the delays of each of said inverter delay circuits of said ring oscillator.

12. The combination recited in claim 11 wherein said controlling means comprises means for causing each of said inverter delay circuits of said phase shifter and said ring oscillator to be determined by a feedback current in said phase-locked loop.

13. The combination recited in claim 12 wherein said inverter delays circuits of said phase shift means and said oscillator are differential inverters.

14. The combination recited in claim 8 wherein said phase-locked loop means further comprises a phase detector responsive to the exclusive OR signal and the output of said oscillator, said oscillator being a current controlled oscillator responsive to said phase detector.

15. In combination:
   a phase shifter adapted to receive a non-return-to-zero input data signal and provide an output signal shifted in phase from the input data signal, said phase shifter comprising a plurality of delay circuits connected in a series;
   an exclusive OR responsive to the input data signal and the phase shifted signal from the phase shifter;
   a phase-locked loop comprising a ring oscillator for providing an output synchronized to an output of the exclusive OR, said ring oscillator comprising a plurality of delay circuits connected in a loop; and
   means for operating the delay circuits of said phase shifter in accordance with the delays of the delay circuits of said ring oscillator to provide a 90° phase shift at the frequency of said output of said ring oscillator.

16. The combination recited in claim 15 wherein said delay circuits of said phase shifter are replicas of said delay circuits of said ring oscillator.

17. The combination recited in claim 16 wherein said delay circuits of said phase shifter and said ring oscillator comprise differential inverters.

18. The combination recited in claim 17 further comprising means for operating said differential inverters of said phase shifter under the same operating conditions as said differential inverters of said ring oscillator.

19. The combination recited in claim 18 further comprising a phase detector responsive to said output of said exclusive OR and said output of said ring oscillator, and wherein said operating means comprises means responsive to said phase detector for generating bias voltage for said differential inverters of said phase shifter and said ring oscillator.

20. A clock and data recovery system for an incoming non-return-to-zero input data signal, comprising:
   a phase shifter comprising a plurality of differential inverters connected in series, said phase shifter being adapted to receive a non-return-to-zero input data signal at a first one of said differential inverters in said series and provide an output signal from a last differential inverter in said series wherein said output signal is shifted in phase from said data input signal;

an exclusive OR responsive to the input data signal and the phase shifted signal from said phase shifter to provide a signal including a frequency component of an originating clock of said non-return-to-zero input data;

a phase-locked loop comprising a current controlled oscillator and a phase detector responsive to said signal from said exclusive OR and an output from said current controlled oscillator, said current controlled oscillator comprising a ring oscillator of differential inverters and being responsive to said phase detector to cause said output of said current controlled oscillator to be driven into synchronism with said frequency component of said originating clock of said non-return-to-zero input data;

said differential inverters of said phase shifter being replicas and being operated under the same operating and bias conditions as said differential inverters of said ring oscillator to produce a total delay equal to 90° at the output frequency of said ring oscillator;

said ring oscillator comprising an even number of differential inverters with the outputs of a single differential inverter being reversed to the inputs of another differential inverter in the ring of differential inverters to provide oscillation with said even number of differential inverters;

said output from said current controlled oscillator to said phase detector being connected to the outputs of a first differential inverter;

said current controlled oscillator having a quadrature output connected to the differential outputs of a differential inverter spaced half the total number of differential inverters in said ring from said first differential inverters; and a decision circuit having a data input fed by said non-return-to-zero input data signal and clock input fed by said quadrature output from said current controlled oscillator to provide clean logical outputs of 1's and 0's.

21. A method of recovering a clock from a non-return-to-zero input data signal, comprising the steps of:

shifting the phase of the non-return-to-zero input data signal to provide a phase shifted signal;

exclusive ORing the input data signal and the phase shifted signal to provide an output signal having a frequency component of an originating clock of the non-return-to-zero input data signal;

feeding the exclusive ORing output signal to a phase detector of a phase-locked loop further comprising a current controlled oscillator having an output fed to said phase detector to drive the output of said current controlled oscillator to the frequency of said originating clock of said non-return-to-zero input data signal; and controlling the delay of the phase shifting step in accordance with the phase-locked loop to provide a phase shift of 90° at the output frequency of said current controlled oscillator.

22. The method recited in claim 21 wherein said phase shifting step comprises a step of passing said non-return-to-zero input data signal through a series of differential inverters.

23. The method recited in claim 22 wherein said current controlled oscillator comprises a ring of differential inverters, and said delay controlling step comprises a step of operating said differential inverters of said phase shifting step under the same operating and bias conditions as said differential inverters of said current controlled oscillator to cause each of said differential inverters of said phase shifting step to have the same delay as said differential inverters of said current controlled oscillator.

* * * * *